United States Patent [19]

Sagawa et al.

[11] Patent Number: 5,283,677
[45] Date of Patent: Feb. 1, 1994

[54] LIQUID CRYSTAL DISPLAY WITH GROUND REGIONS BETWEEN TERMINAL GROUPS

[75] Inventors: Fumihiko Sagawa; Takehiro Ishikawa; Takao Tanaka, all of Iwaki, Japan

[73] Assignee: Alps Electric Co., Ltd., Tokyo, Japan

[21] Appl. No.: 886,989

[22] Filed: May 21, 1992

[30] Foreign Application Priority Data

May 31, 1991 [JP] Japan .................................. 3-156203

[51] Int. Cl.$^5$ .......................................... G02F 1/1343
[52] U.S. Cl. ........................................ 359/88; 359/87
[58] Field of Search ................ 359/54, 61, 87, 88, 359/89, 83; 340/784, 794, 765, 78; 361/398

[56] References Cited

U.S. PATENT DOCUMENTS

| 4,655,551 | 4/1987 | Washizuka et al. | 359/83 |
| 4,772,100 | 9/1988 | Suengana | 359/88 X |
| 4,799,771 | 1/1989 | Taniguchi | 359/83 X |
| 4,836,651 | 6/1989 | Anderson | 359/87 |
| 4,906,071 | 3/1990 | Takahara et al. | 359/88 X |
| 5,016,989 | 5/1991 | Kawashima et al. | 359/87 X |

FOREIGN PATENT DOCUMENTS

| 0404528 | 12/1990 | European Pat. Off. . |
| 0441398 | 8/1991 | European Pat. Off. . |
| 1-237523 | 9/1989 | Japan . |
| 0301724 | 12/1990 | Japan . |
| 0045934 | 1/1991 | Japan . |
| 0046691 | 1/1991 | Japan . |

Primary Examiner—William L. Sikes
Assistant Examiner—Kenneth Parker
Attorney, Agent, or Firm—Guy W. Shoup; Patrick T. Bever

[57] ABSTRACT

A liquid crystal display in which an LCD is protected against the influence of static electricity or noise, and the color shading in the peripheral part of the display area of the LCD is suppressed. A ground terminal is provided in the area between the electrode terminals 5$a$ and 5$b$ of the LCD 1, the electrode terminals being adjacently positioned and connected to different flexible substrates 6 and 6. The ground terminal is electrically independent of the electrode terminal group 5's, and has a similar shape to that of the area between two electrode terminals. A ground pattern 13, which is independent of the lead pattern group 8's and connected to the ground terminal 12, is provided on each flexible substrate 6. The ground pattern 13 is grounded through a printed circuit board.

1 Claim, 2 Drawing Sheets

LIQUID CRYSTAL DISPLAY WITH GROUND REGIONS BETWEEN TERMINAL GROUPS

BACKGROUND OF THE INVENTION

1. Field of the Invention

The present invention relates to a liquid crystal display apparatus in which an electrode terminal group of liquid crystal display elements (hereinafter referred to as LCD) are connected to a printed circuit board through flexible substrates.

2. Description of the Prior Art

FIG. 3 is a partial plan view showing an example of a conventional liquid crystal display apparatus.

In the figure, an LCD which is shown collectively by a symbol 1 comprises an upper glass substrate 2, a lower glass substrate 3, liquid crystal being sealed between the glass substrates 2 and 3, a polarizing plate, not shown in a drawing, etc. On the opposing surfaces of the substrates 2 and 3, transparent electrode group 4's are patterned, and from each transparent electrode 4, a terminal 5 is protrusively formed toward a connecting edge portion (a terminal portion) of the LCD 1. The transparent electrode group 4's and the electrode terminal group 5's are composed of ITO and the like, and they are formed in a unity.

A flexible substrate collectively shown by a symbol 6 comprises a base film 7 composed of a polyimide film, etc., a plurality of lead patterns 8's formed by etching a copper film on the base film 7, and a cover film, not shown in a drawing, covering the lead patterns 8's, and on both edge portions of the base film 7, the lead pattern group 8's are exposed. Electronic parts 9 such as an LSI are mounted on the flexible substrate 6.

After an anisotropic conductive sheet, not shown in a drawing, is stuck on the connecting edge portion of the LCD 1 where the electrode terminal group 5's are exposed, a plurality of flexible substrates 6, 6,—are placed in parallel on the edge portion in a state where the electrode terminal group 5's and the lead pattern group 8's are aligned, and the corresponding electrode terminal 5 and the lead pattern 8 are connected and fixed through the above-mentioned anisotropic conductive sheet by pressing and heating each flexible substrate 6 using a heater tip, etc.

A circuit pattern for driving the LCD 1 is formed on the printed circuit board denoted collectively by a symbol 10, and a connecting terminal group 11's of the circuit pattern are connected and fixed to the lead pattern group 8's of the flexible substrate 6 through the anisotropic conductive sheet similar to the above-mentioned connecting constitution.

The printed circuit board 10 is fixed inside a box, not shown in a drawing, by caulking, and a display area of the LCD 1 can be observed through a display window of the box.

In a conventional liquid display apparatus of this kind, a grounding pattern is provided on the printed circuit board 10, and the grounding pattern is connected to the caulking portion of the box as a measure against the disturbances caused by static electricity or noise in the printed circuit board 10, but the LCD itself is not grounded, so that there may occur an erroneous operation (erroneous display) in the LCD I influenced by static electricity or noise.

There is no lead pattern 8 between the adjacent flexible substrates 6 and 6 in the connecting edge portion of the LCD 1, and, as shown in FIG. 3, the electrode terminal group 5's to be connected to a flexible substrate 6 are extended from the transparent electrode group 4's toward the edge portion forming a space between them which gets narrower toward the edge portion; thereby, an area A which gets wider toward the edge portion having no terminals in it occurs between an electrode terminal 5a to be connected to one of the flexible substrates 6 and 6 which are disposed adjacently and another electrode terminal 5b to be connected to another one of the flexible substrates 6 and 6. The area A having no terminal in it is an area where a cell gap is larger than the other area by the thickness of the electrode terminal 5; thereby, there can be a defect that color shades are apt to occur in the peripheral part of the display area of the LCD 1.

The present invention is invented considering the above-mentioned circumstances, and an object of the invention is to offer a liquid crystal display apparatus which is not easily influenced by static electricity or noise and also color shades are not easily generated in the peripheral part of the display area of the LCD 1.

SUMMARY OF THE INVENTION

The above-mentioned object can be achieved by an arrangement described in the following. In a liquid crystal apparatus: a plurality of flexible substrates are disposed in parallel in the peripheral part of an liquid crystal display element from which electrode terminal groups are protrusively formed, and the electrode terminal groups are led to a printed circuit board through lead pattern groups formed on the flexible substrates; ground terminals being electrically independent from the above-mentioned electrode terminals are disposed in a space between the electrode terminal groups to be connected to the flexible substrates provided in parallel adjacently to each other; and ground patterns which are electrically independent from the above-mentioned lead pattern group and connected to the ground terminals are provided on the flexible substrates being connected to the above-mentioned ground terminals, and the ground patterns are connected to the ground through the printed circuit board.

When the ground terminals of an LCD are grounded through the ground patterns on the flexible substrates or the grounding patterns on the printed circuit board, the LCD is not easily influenced by static electricity or noise, which makes it possible to improve the reliability of the LCD. When the ground terminals are disposed in an area where electrode terminal group do not exist in the connecting edge portion of the LCD, the cell gaps in the whole edge portion are uniformalized; thereby, the occurrence of color shades can be suppressed.

As described in the above, according to the present invention, since the ground terminals of the LCD are grounded through the ground patterns on flexible substrates, so that the LCD is not easily influenced by static electricity or noise and the erroneous operation (erroneous display) can be prevented, and since the cell gaps in the connecting edge portion of the LCD are uniformalized by the existence of the ground terminals, color shades in the peripheral part of the display area can be suppressed. Thereby it is made possible to offer a remarkable effect to upgrade the reliability and the display quality of the LCD.

DETAILED DESCRIPTION OF THE PREFERRED EMBODIMENT

An embodiment according to the present invention will be explained based on the drawings in the following.

Figure 1:
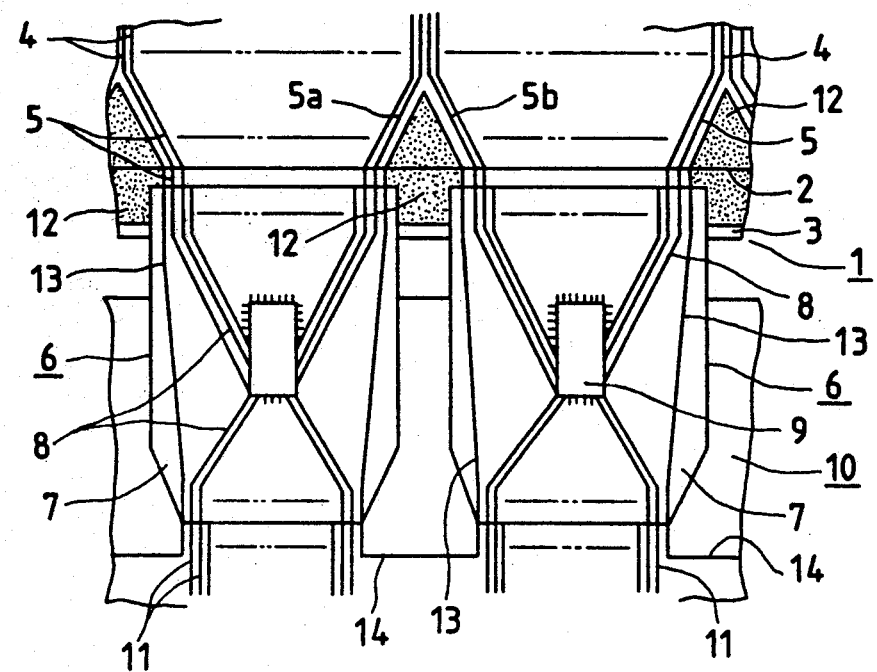
FIG. 1 is a plan view of an essential part of a liquid crystal display apparatus according to an embodiment of the invention.
Figure 3:
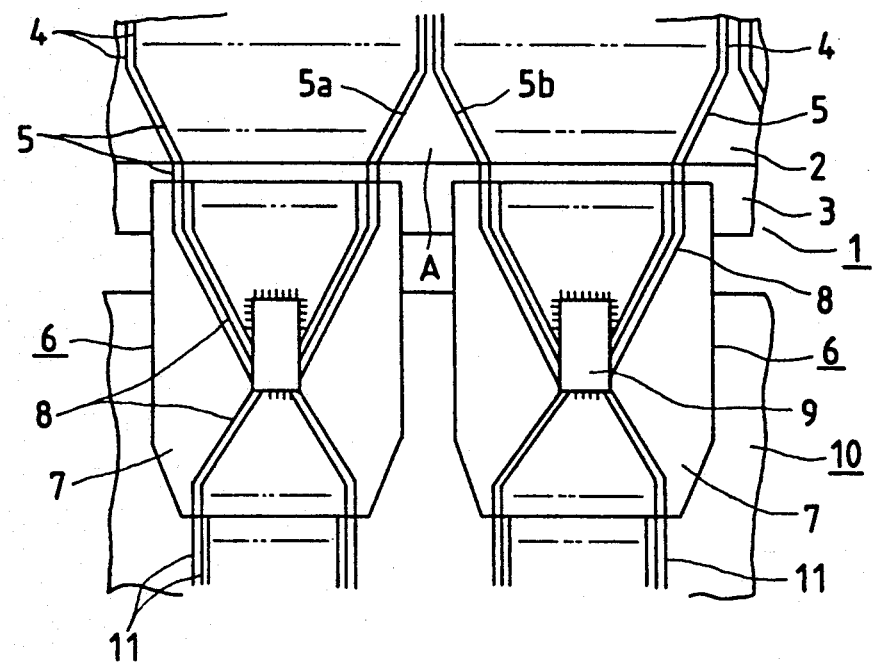
FIG. 3 is a partial plan view of a conventional liquid crystal display apparatus.
Figure 2:
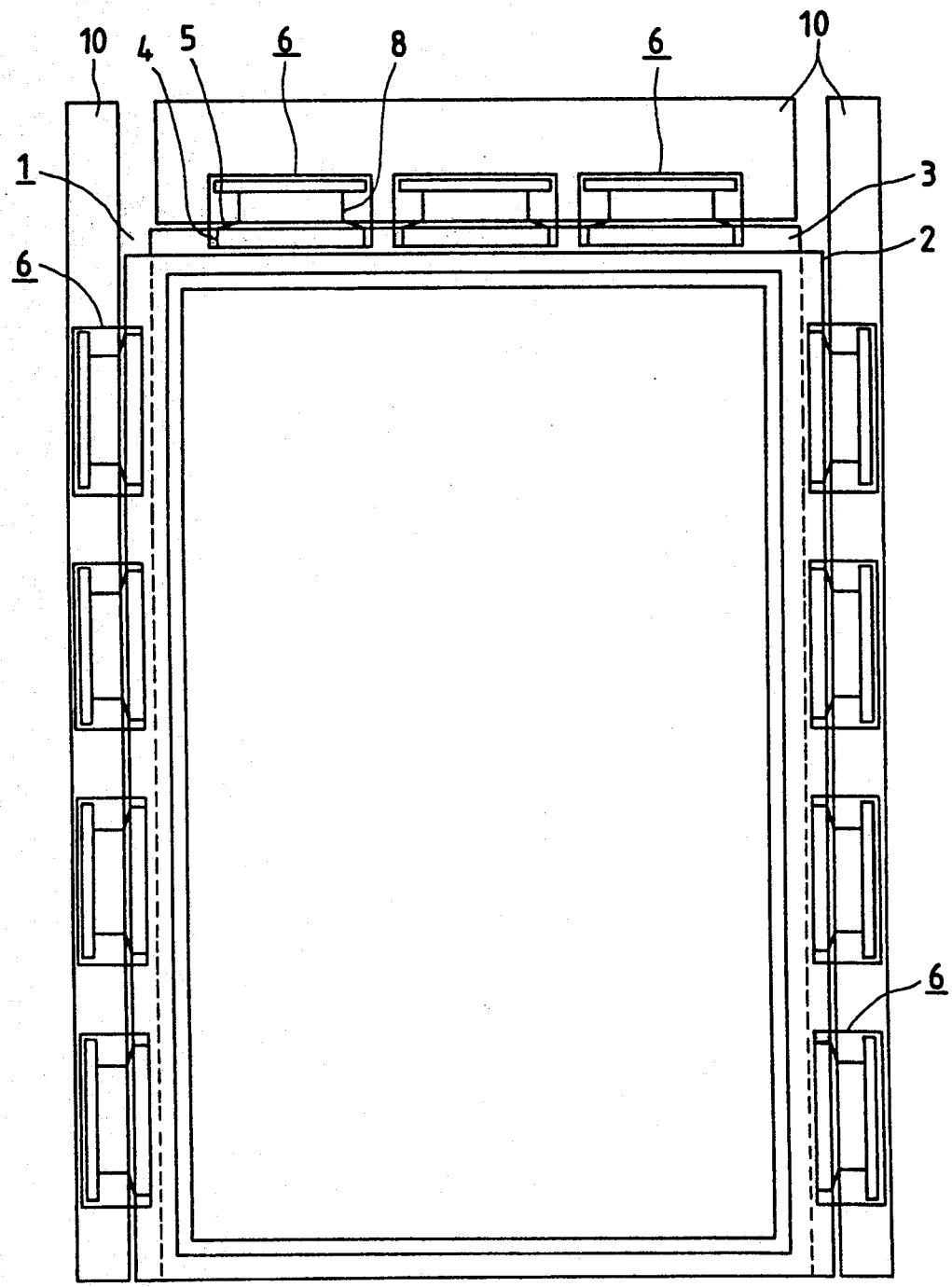
FIG. 2 is an outline plan view, partly omitted, showing the whole of the liquid crystal display apparatus in the above-mentioned embodiment.

FIG. 1 is a plan view of an essential part of a liquid crystal display apparatus according to an embodiment of the present invention, and FIG. 2 is an outline plan view, partly omitted, of the whole of the liquid crystal display apparatus, and the same symbols are given to the parts corresponding to those explained in FIG. 3 and the duplicated explanation will be omitted.

In the case of an liquid crystal display apparatus shown in FIGS. 1 and 2, ground terminals 12's which are electrically independent from the electrode terminal group 5's are formed at specified positions in the connecting edge portion of the LCD 1 where the electrode terminal group 5's are exposed, to be concrete, the ground terminals are formed at the positions which overlap with flexible substrates 6 and 6 being placed adjacently to each other on the edge portion, and on the other hand, first ground patterns 13's which are electrically independent of the lead pattern group 8's are formed on both sides of the respective lead pattern group 8's on the respective flexible substrates 6's, and an end part of each first ground pattern 13 is connected and fixed to the ground terminal 12 and the other end part is connected and fixed to a second ground pattern 14 of the printed circuit board 10.

As clearly seen from FIG. 1, ground terminals 12's, being composed of ITO, etc., having pentagonal contours along the patterns of electrode terminals 5a and 5b, are provided in an area between the electrode terminal 5a to be connected to one of the flexible substrates 6 and 6 disposed adjacently to each other and the electrode terminal 5b to be connected to another one of the flexible substrates 6 and 6. The ground terminals 12's are so set that when a plurality of flexible substrates 6, 6,—, are placed in the connecting edge portion of the LCD 1 in a state where the electrode terminal group 5's and the lead pattern group 8's are aligned, first ground pattern 13 and 13 of the adjacent flexible substrates 6 and 6 are positioned over a common ground terminal 12. Therefore, the corresponding electrode terminals 5's and the lead patterns 8's are connected and fixed through an anisotropic conductive sheet (not shown in a drawing), which is stuck to the connecting edge portion beforehand, and also the end parts on a side of respective first ground pattern are connected and fixed to the nearest ground terminals 12's by pressing and heating flexible substrates 6's on the connecting edge portion of the LCD 1 using a heater tip, etc. The above-mentioned ground terminals 12's are formed in a unity with transparent electrode terminal group 4's and electrode terminal group 5's, so that the material composing them and the thickness of them are the same. The first ground patterns 13's are formed by etching copper films similar to the way in which the lead pattern group 8's are formed.

The lead pattern group 8's, connecting terminal group 11's for driving the LCD 1, and the first ground patterns 13's are connected and fixed to the printed circuit board 10; and second ground patterns 14's are provided on it; thereby, the ground terminals 12's of the LCD 1 are grounded through the grounding patterns 14's and the first ground patterns 13's.

In other words, in the above-mentioned embodiment, the measures against static electricity and noise of the LCD 1 are taken by providing the ground terminals 12's, the first ground patterns 13's and the second ground patterns 14's, and the LCD 1 is prevented from an erroneous operation (erroneous display) caused by static electricity and noise. The grounding patterns are provided in many places on the printed circuit board 10, and not only the LCD 1 but also the printed circuit board itself is prevented from the influence of static electricity or noise.

In the above-mentioned embodiment, in the areas where color shades are apt to occur caused by the non-existence of the electrode terminal group 5's in the connecting edge portion of the LCD 1, ground terminals 12's are provided having similar shapes and thicknesses to those of the areas, so that the cell gaps over the whole area of the connecting edge portion of the LCD 1 are unformalized; thereby, there occurs almost no color shade in the peripheral part of the display area of the LCD 1, which makes it possible to improve the quality of display.

Moreover, in the above-mentioned embodiment, the ground terminal 12, the transparent electrode 4 and the electrode terminal 5 are formed in a unity, and also the first ground pattern 13 of the flexible substrate 6 and the lead pattern 8 are formed in a unity; therefore, the manufacturing process is not complicated and there is no fear of increased cost.

What is claimed is:

1. A liquid crystal display apparatus comprising:

a liquid crystal element including a plurality of electrode terminals formed into terminal groups and arranged along an edge portion of said liquid crystal element;

a plurality of flexible substrates connected to said edge portion of said liquid crystal element, each flexible substrate including a printed circuit board connected to an associated terminal group by a lead pattern group;

ground terminals formed on each side of each of said terminal groups and being electrically independent of said electrode terminals and having contours similar to pattern shapes of the space between the terminal groups, said ground terminals being disposed on said liquid crystal element adjacent said edge portions and between adjacent electrode terminal groups; and ground patterns, being electrically independent of said lead pattern groups disposed on said flexible substrates and connected to said ground terminals and grounded through said printed circuit board.

* * * * *